(12) United States Patent
Jang

(10) Patent No.: US 7,060,572 B2
(45) Date of Patent: Jun. 13, 2006

(54) MOSFET WITH SHORT CHANNEL STRUCTURE AND FORMATION METHOD THEREOF

(75) Inventor: Wen-Yueh Jang, Hsinchu (TW)

(73) Assignee: Winbond Electronics Corporation, Hsinchu (TW)

(*) Notice: Subject to any disclaimer, the term of this patent is extended or adjusted under 35 U.S.C. 154(b) by 69 days.

(21) Appl. No.: 10/916,111

(22) Filed: Aug. 11, 2004

(65) Prior Publication Data

US 2005/0017307 A1    Jan. 27, 2005

Related U.S. Application Data

(62) Division of application No. 10/244,535, filed on Sep. 17, 2002, now abandoned.

(51) Int. Cl.
    *H01L 21/336* (2006.01)
(52) U.S. Cl. .............. 438/289; 438/290; 438/291
(58) Field of Classification Search ........ 438/289, 438/290, 291
    See application file for complete search history.

(56) References Cited

U.S. PATENT DOCUMENTS 5,856,225 A * 1/1999 Lee et al. ............. 438/291
6,607,958 B1 * 8/2003 Suguro ................. 438/287

* cited by examiner

*Primary Examiner*—Douglas W. Owens
(74) *Attorney, Agent, or Firm*—Dickinson Wright PLLC

(57) ABSTRACT

A MOSFET with a short channel structure and manufacturing processes for the same are described. The MOSFET has a substrate, a channel region, a source/drain region, a gate dielectric layer and a conductive layer. The channel region in the substrate includes a first region and a second region, in which the first region has a first threshold voltage and the second region has a second threshold voltage, respectively. The first threshold voltage is smaller than the second threshold voltage. The first threshold voltage of the first region can also be adjusted to reduce or increase effectively the resistance of the MOSFET when the MOSFET is turned on or off. Additionally, the first region has a shallower junction depth than that of the normal source/drain extension.

16 Claims, 4 Drawing Sheets

MOSFET WITH SHORT CHANNEL STRUCTURE AND FORMATION METHOD THEREOF

CROSS-REFERENCE TO RELATED APPLICATIONS

This application is a divisional of U.S. patent application Ser. No. 10/244,535, filed Sep. 17, 2002, now abandoned.

FIELD OF THE INVENTION

The present invention generally relates to semiconductor structures and processes, and more particularly, to a MOSFET with a short channel structure and manufacturing method.

BACKGROUND OF THE INVENTION

With the rapid increment of integration and operating frequency of integrated circuits (ICs), the size of the IC must shrunk to meet the requirements of the semiconductor industry. A source/drain extension, a gate length, and junction depth of the source/drain particularly need to be diminished to solve the problems of process complexity and severe short channel effects.

To solve the problem of the short channel effects, a junction depth reduction of the source/drain extension has been developed. FIG. 1 shows a cross-sectional view of a conventional MOSFET. A source/drain 102 is formed on a substrate 100 and a channel region 104 is located between the source and the drain 102. Additionally, a source/drain extension 106 is positioned between the source/drain 102 and the channel region 104, and a spacer 112 is located above the source/drain extension 106. A gate oxide layer 108 and a gate 110 are deposited on the channel region 104.

However, doping concentration and junction depth of the source/drain extension 106 are lower and shallower, respectively, than those of the source/drain 102, which lead to worse performance of the MOSFET when the gate is turned on. Moreover, for techniques below 0.1 µm, the junction depth of the source/drain 106 must be lower than 330 angstroms or much less. Therefore, to obtain a shallow junction depth in the source/drain extension 106, many doping and annealing steps tightly controlled bring additional cost and complexity during processing.

Consequently, how to improve device performance due to a high resistance in the source/drain extension is an important problem and is currently a main issue for semiconductor manufacturers.

SUMMARY OF THE INVENTION

One object of the present invention is to utilize a MOSFET with a short channel structure including lower threshold voltages to replace a source/drain extension. There are three MOSFETs having a variety of threshold voltages to substantially decrease the serial resistance of MOSFETs.

Another object of the present invention is to use a MOSFET with a short channel structure including lower threshold voltages to replace a source/drain extension. A shallow junction depth is formed when the gate of the MOSFET is turned on.

According to the above objects, the present invention sets forth a MOSFET with a short channel structure and processes. A first ion implantation is performed on a substrate to generate a first threshold voltage. Thereafter, a channel region is defined on the substrate by a sacrificial layer. A source/drain implanted in the substrate adjoins the channel region. A first dielectric layer is deposited on the substrate and then the sacrificial layer and a portion of first dielectric layer are stripped away. An opening is formed in the sacrificial layer to expose the channel region. Afterwards, a second dielectric layer is deposited on the first dielectric layer and the channel region.

Performing an anisotropic etching on the second dielectric layer creates spacers connected to the sidewall of the opening. A second ion implantation is carried out so that a portion of channel region is exposed to define a second region, in which the first region contacts the second region. Specifically, after the spacers over the first region are removed, the first threshold voltage of the first region lower than the second threshold voltage of the second region is constructed.

When a voltage applied to the gate increases, the resistance of the first region is effectively reduced the overall resistance between the source and the drain. If the turn-on voltage is higher than the threshold voltage of the first region, the first region has a sufficient low resistance. When the gate is turned off, the first region has a very high resistance to reduce leakage current between the source and drain.

In the present invention, the first region specifically has a threshold voltage lower than that of the second region to replace the conventional source/drain extension. More importantly, the second region has a much shorter channel length for a same channel region in the conventional MOSFET.

In summary, the present invention provides the MOSFET with a short channel structure. The first region provides a lower resistance to increase an operating current between the source/drain when the gate is turned on. The first region has a very high resistance to substantially decrease the subthreshold current when the gate is turned off. Moreover, the junction depth of the first region is shallower than that of the conventional source/drain extension to reduce the short channel effects.

BRIEF DESCRIPTION OF THE DRAWINGS

The foregoing aspects and many of the attendant advantages of this invention will become more readily appreciated as the same becomes better understood by reference to the following detailed description when taken in conjunction with the accompanying drawings, wherein.

DETAILED DESCRIPTION OF THE PREFERRED EMBODIMENT

The present invention is directed to a MOSFET with a short channel structure to improve the shortcomings of a MOSFET used in the prior art. The present invention is suitable for an NMOS and a PMOS transistor. To illustrate the present invention, an example of the NMOS is set forth in details as follows.

Figure 1:
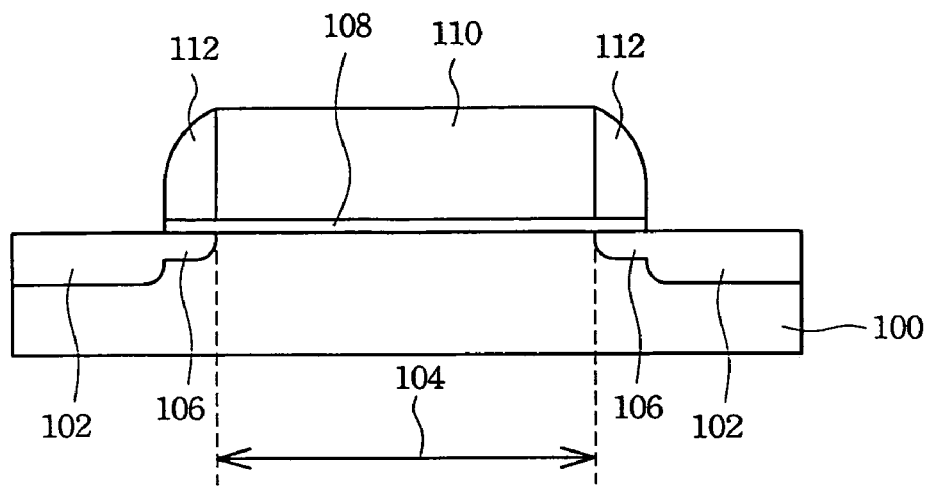
FIG. 1 illustrates a cross-sectional view of a conventional MOSFET.
Figure 2A:
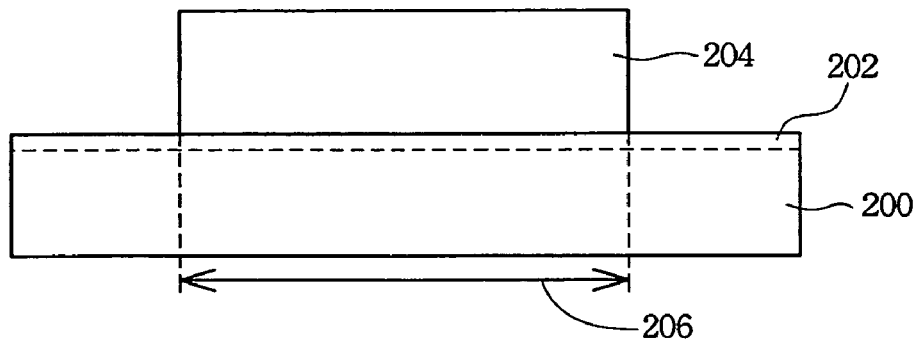
FIGS. 2A–2K illustrate process cross-sectional views of a MOSFET with low a short channel structure according to the present invention.

FIGS. 2A–2K show process cross-sectional views of a MOSFET with a short channel structure according to the present invention. In FIG. 2A, performing a first ion implantation 202 on a substrate 200 obtains a doping concentration of a first threshold voltage, in which the first threshold voltage can be changed with the doping concentration. In the preferred embodiment of the present invention, the dopant of the first ion implantation 202 includes boron (B) which has an implanting energy range of about 5 to 70 keV and an doping concentration range of about $1\times10^{12}$ $cm^{-2}$ to $3\times10^{13}$ $cm^{-2}$.

Afterwards, a sacrificial layer 204 is formed on the substrate 200. For example, the formation of the sacrificial layer 204 includes a chemical vapor deposition (CVD) and the sacrificial layer 204 has a thickness range of about 600 to 3000 angstroms. Conducting lithography and etching processes on the sacrificial layer 204 defines a channel region 206. In the preferred embodiment of the present invention, the material of the sacrificial layer 204 includes nitrides, such as silicon nitrides ($Si_3N_4$) or oxynitrides ($SiO_xN_y$).

Figure 2B:
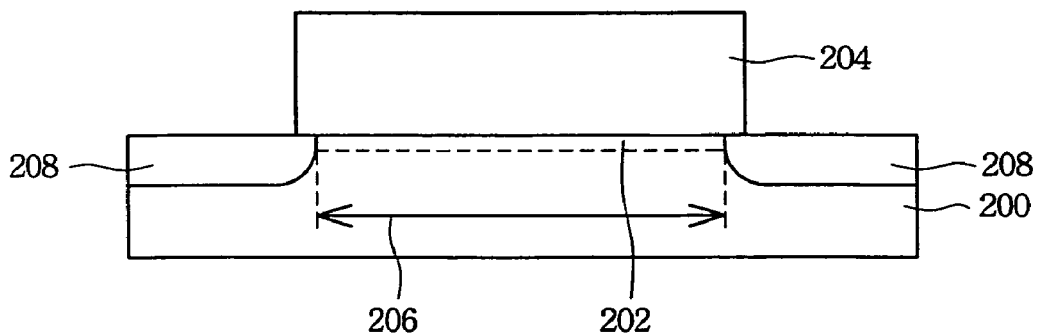
Figure 2C:
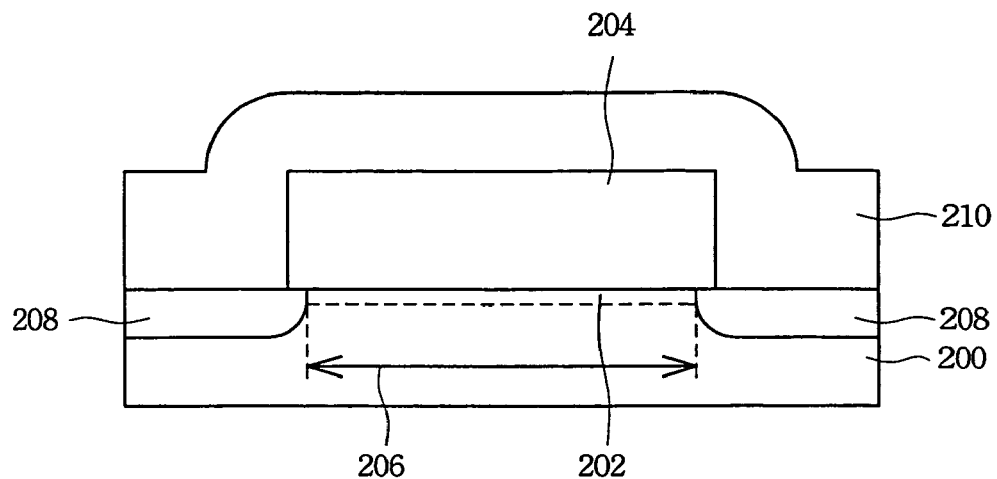
Figure 2D:
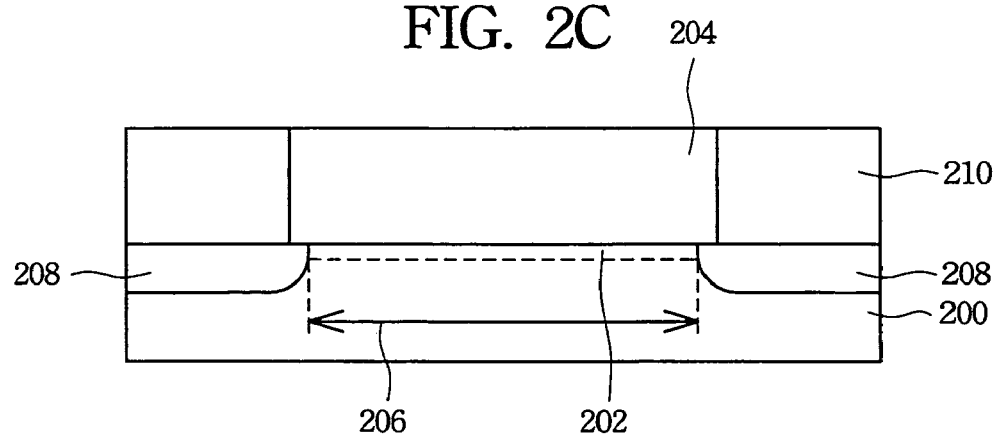

In FIG. 2B, a source/drain 208 formed on the substrate 200 near the channel region 206 is connected to the channel region 206, in which the dopant material of the source/drain 208 includes phosphorus (P) or arsenic (As) and has a doping concentration range of about $1\times10^{15}$ $cm^{-2}$ to $3\times10^{16}$ $cm^{-2}$. In FIG. 2C, a first dielectric layer 210 formed on the substrate 200 and the sacrificial layer 204 has a thickness range of about 800 to 3000. In FIG. 2D, a portion of the first dielectric layer 210 is removed to expose the sacrificial layer 204. For example, chemical mechanical polishing (CMP) or etching back is used to remove the portion of the first dielectric layer 210.

Figure 2E:
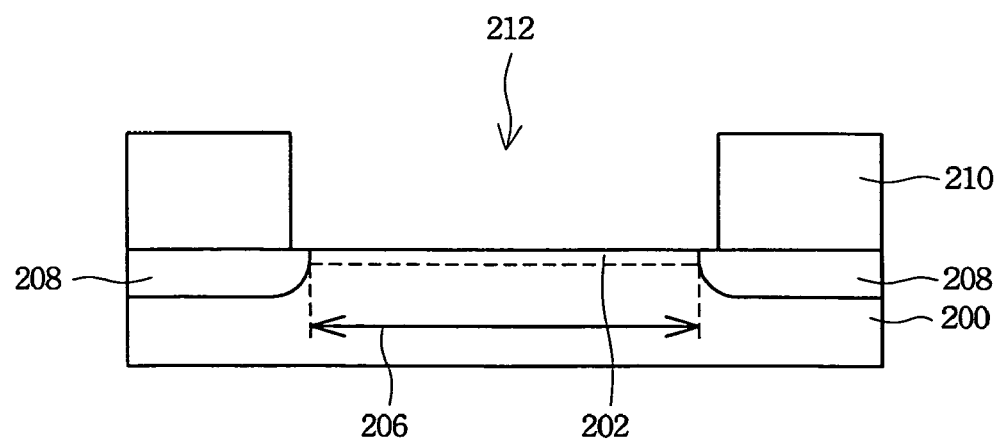
Figure 2F:
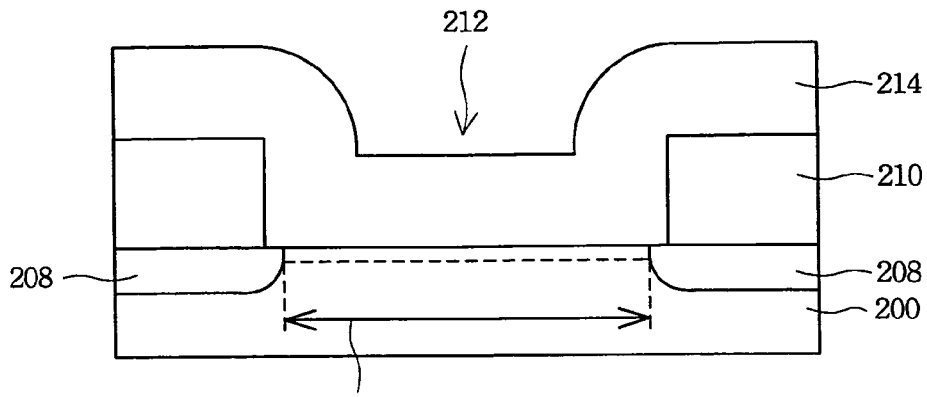

In FIG. 2E, the sacrificial layer 204 is stripped to form an opening 212 on the first dielectric layer 210 and to expose the channel region 206. Additionally, the first ion implantation 202 shown in FIG. 2A can be performed after this step. In FIG. 2F, a second dielectric layer 214 is formed on the first dielectric layer 210 and the channel region 206 to fill the opening 212 in the channel region 206.

Figure 2G:
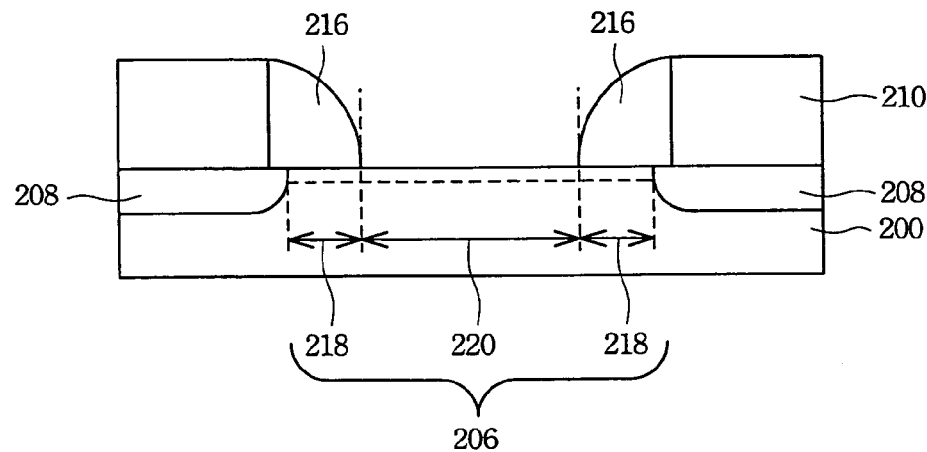

In FIG. 2G, conducting an anisotropic etching process on the second dielectric layer 214 generates spacers 216 adjacent to the opening 212 in the channel region 206. The channel region 206 has a first region 218 and a second region 220, in which the second region 220 contacts the first region 218. The second dielectric layer 214 preferably has a thickness range of about 100 to 800 angstroms. The first region 218 located between the second region 220 and the source/drain separates the second region 220 and the source/drain 208.

Figure 2H:
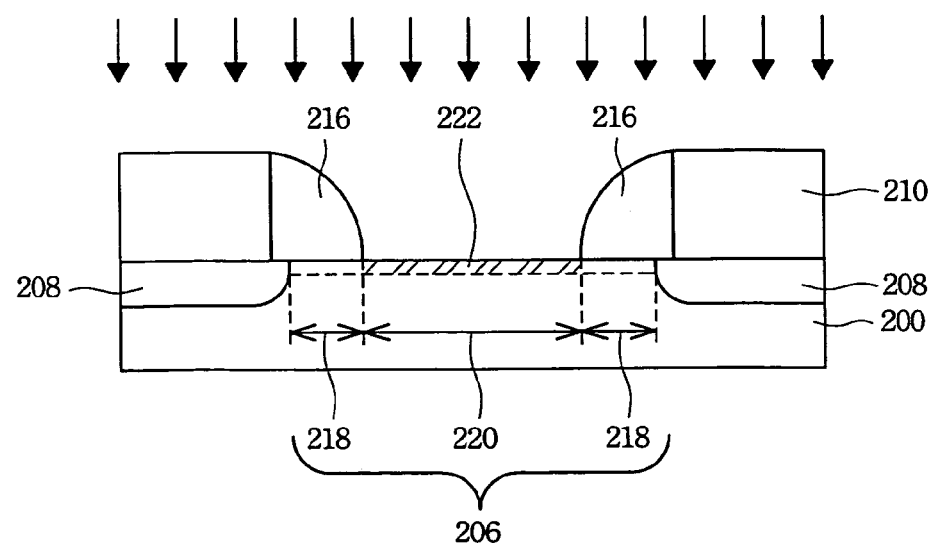

In FIG. 2H, performing a second ion implantation 222 obtains a second threshold voltage of the second region 220 in the channel region 206, in which the second threshold voltage can be adjusted by the second ion implantation 222. The dopant of the second ion implantation 222 preferably includes boron (B) which has an implanting energy range of about 10 to 70 keV and a doping concentration range of about $1\times10^{12}$ $cm^{-2}$ to $3\times10^{13}$ $cm^{-2}$. Also, both the first ion implantation 202 and the second ion implantation 222 preferably have the same dopant of electric type, such as P-type or N-type.

Figure 2I:
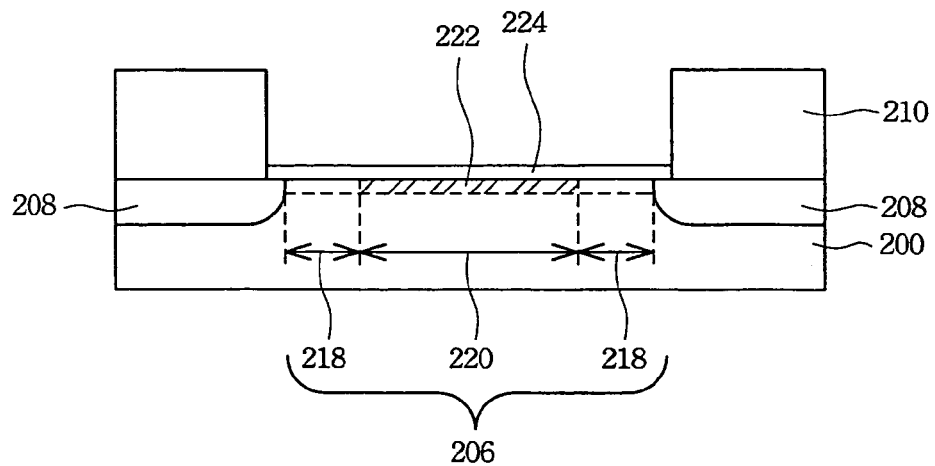
Figure 2J:
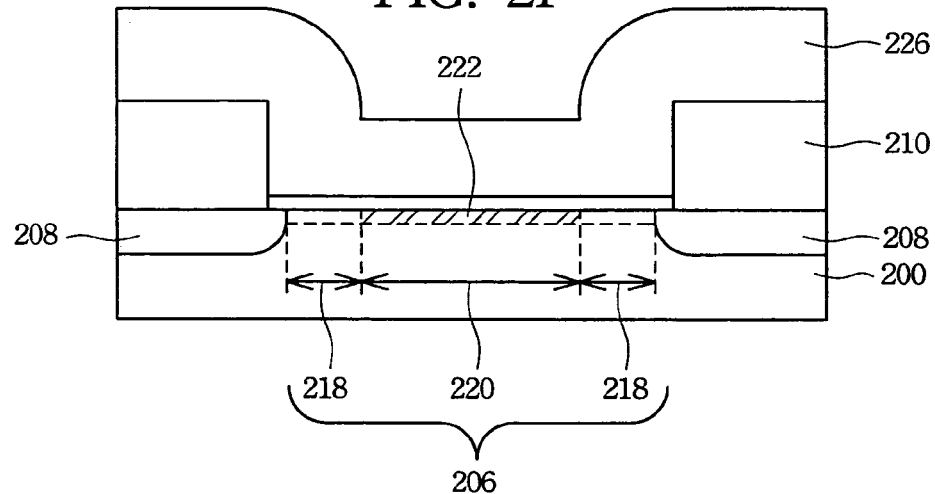
Figure 2K:
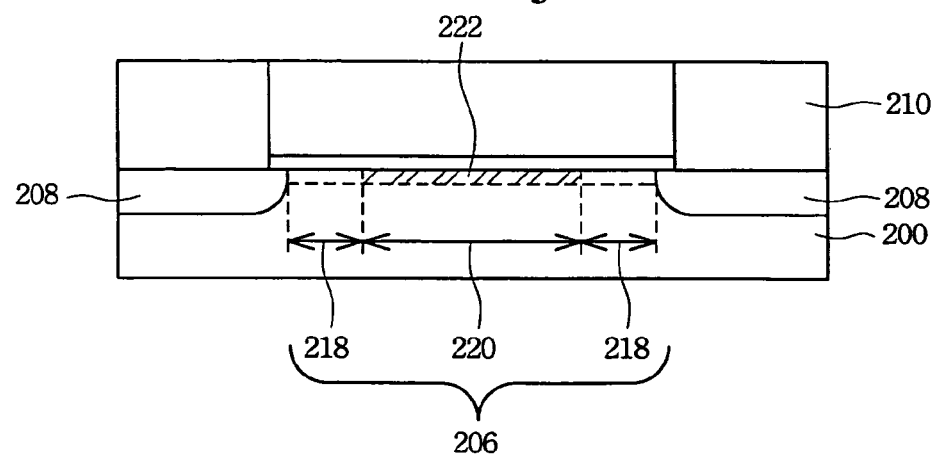

In FIG. 2I, the spacers 216 in the first region 218 are removed to expose the first region 218 with the first threshold voltage. Specifically, the first threshold voltage of the first region 218 is lower than the second threshold voltage of the second region 220. Thereafter, a gate dielectric layer 224 is formed on the channel region 206. In FIG. 2J, a conductive layer 226 is simultaneously formed on the gate dielectric layer 224 and the first dielectric layer 210. For example, the material of the conductive layer 226 includes polysilicons and polycides. In FIG. 2K, the conductive layer 226 higher than the first dielectric layer 210 is removed to generate a MOSFET with a short channel structure.

In the present invention, the first region 218 connected to the second region 220 is formed by the spacers 216 and the first region 218 has a lower threshold voltage than that of the second region 220. Moreover, the first region 218 replaces the conventional source/drain extension. Alternatively, more than two lower threshold voltage regions can be formed in the channel region 206.

When a voltage applied to the gate increases, the resistance of the first region 218 is effectively reduced the overall resistance between the source and the drain 208. If the gate voltage is higher than the threshold voltage of the first region 218, the first region 218 has a low channel resistance. When the gate is turned off, the first region 218 has a very high channel resistance. Additionally, because the first region 218 and the second region 220 are serially connected together, the sub-threshold current passing through the channel region 206 is preferably reduced.

In other words, when the gate of the MOSFET is turned on or off, the channel resistance in the first region 218 will be adjusted by the gate voltage of the first region 218 so that the MOSFET has an improvement of operation performance.

Further, since the first region 218 is formed by a lower threshold voltage is implanted within the channel region 206, the effective channel length of the second region 220 of MOSFET can be shorter than conventional channel length. Therefore, the increasing current output makes the performance of the MOSFET optimal.

In addition, since the first region 218 separates both the source/drain 208 and the second region 220 having a lower doping concentration than that of the second region 220, it will reduce the overall junction capacitance of the source/drain of the MOSFET. Since the first channel region 218 with which replaces the source/drain extension is a MOSFET, the junction depth of the first region 218 is same as that of the second region 220 when the MOSFET is turned on. Therefore, the short channel effects of the second region 220 of the MOSFET are effectively reduced.

According to the above-mentioned, the present invention utilizes a MOSFET with a short channel structure. When the gate of the MOSFET is turned on, the channel resistance of the first region is reduced so as to reduce the overall resistance between the source and the drain. When the gate is turned off, the first region has a high channel resistance to decrease the sub-threshold current of the MOSFET. Moreover, the second region is formed by using spacers to crease a short channel length so that the equivalent resistance of the source/drain extension isn't increased. The junction depth of the first region is shallower than that of the conventional source/drain extension to reduce the short channel effects of the second region of the MOSFET.

As is understood by a person skilled in the art, the foregoing preferred embodiments of the present invention are illustrative rather than limiting of the present invention. It is intended that they cover various modifications and similar arrangements be included within the spirit and scope of the appended claims, the scope of which should be accorded the broadest interpretation so as to encompass all such modifications and similar structure.

What is claimed is:

1. A method for forming a MOSFET with a short channel structure, the method comprising the steps of:
   performing a first ion implantation into a substrate resulting in the substrate having a first threshold voltage;

forming a sacrificial layer on the substrate to define a channel region;

forming a source/drain on the substrate, wherein the source/drain are coupled to the channel region;

forming a first dielectric layer on the substrate and the sacrificial layer;

removing a portion of the first dielectric layer to expose the sacrificial layer;

removing the sacrificial layer to generate an opening in the first dielectric layer and to expose the channel region;

forming a second dielectric layer on the first dielectric layer and the channel region;

performing an anisotropic etching on the second dielectric layer to form a plurality of spacers adjacent to the opening, wherein a portion of the channel region of the substrate is defined as a first region and an exposed channel region;

performing a second ion implantation on the exposed channel region, resulting in the exposed channel region having a second threshold voltage and being defined as a second region;

removing the spacers of the first region, wherein the first threshold voltage of the first region is smaller than the second threshold voltage of the second region;

forming a gate dielectric layer on the channel region; and forming a conductive layer on the gate dielectric layer and the first dielectric layer.

2. The method of claim 1, wherein the first region is located between the second region and the source/drain to separate the second region and the source/drain.

3. The method of claim 1, wherein the first ion implantation and the second ion implantation use a same dopant.

4. The method of claim 3, wherein the same dopant comprises boron.

5. The method of claim 1, wherein the first ion implantation has a doping concentration range of about $1\times10^{12}$ cm$^{-2}$ to $3\times10^{13}$ cm$^{-2}$.

6. The method of claim 1, wherein the second ion implantation has a doping concentration range of about $1\times10^{12}$ cm$^{-2}$ to $3\times10^{13}$ cm$^{-2}$.

7. The method of claim 1, wherein a material of the sacrificial layer comprises silicon nitrides or oxynitrides.

8. The method of claim 1, wherein the sacrificial layer has a thickness range of about 600 to 3000 angstroms.

9. A method for forming a MOSFET with a short channel structure, the method comprising the steps of:

forming a sacrificial layer on a substrate to define a channel region;

forming a source/drain on the substrate, wherein the source/drain are coupled to the channel region;

forming a first dielectric layer on the substrate and the sacrificial layer;

removing a portion of the first dielectric layer to expose the sacrificial layer;

removing the sacrificial layer to generate an opening in the first dielectric layer and to expose the channel region;

performing a first ion implantation into the substrate resulting in the substrate having a first threshold voltage;

forming a second dielectric layer on the first dielectric layer and the channel region;

performing an anisotropic etching on the second dielectric layer to form a plurality of spacers adjacent to the opening, wherein a portion of the channel region of the substrate is defined as a first region and an exposed channel region;

performing a second ion implantation on the exposed channel region, resulting in the exposed channel region having a second threshold voltage and being defined as a second region;

removing the spacers of the first region, wherein the first threshold voltage of the first region is smaller than the second threshold voltage of the second region;

forming a gate dielectric layer on the channel region; and forming a conductive layer on the gate dielectric layer and the first dielectric layer.

10. The method of claim 9, wherein the first region is located between the second region and the source/drain to separate the second region and the source/drain.

11. The method of claim 9, wherein the first ion implantation and the second ion implantation use a same dopant.

12. The method of claim 11, wherein the same dopant comprises boron.

13. The method of claim 9, wherein the first ion implantation has a doping concentration range of about $1\times10^{12}$ cm$^{-2}$ to $3\times10^{13}$ cm$^{-2}$.

14. The method of claim 9, wherein the second ion implantation has a doping concentration range of about $1\times10^{12}$ cm$^{-2}$ to $3\times10^{13}$ cm$^{-2}$.

15. The method of claim 9, wherein a material of the sacrificial layer comprises silicon nitrides or oxynitrides.

16. The method of claim 9, wherein the sacrificial layer has a thickness range of about 600 to 3000 angstroms.

* * * * *